(12) United States Patent
Han et al.

(10) Patent No.: US 8,593,180 B2
(45) Date of Patent: Nov. 26, 2013

(54) CIRCUIT INCLUDING A NEGATIVE DIFFERENTIAL RESISTANCE (NDR) DEVICE HAVING A GRAPHENE CHANNEL, AND METHOD OF OPERATING THE CIRCUIT

(75) Inventors: Shu-Jen Han, Cortlandt Manor, NY (US); Yu-Ming Lin, West Harrison, NY (US); Yanqing Wu, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/418,066

(22) Filed: Mar. 12, 2012

(65) Prior Publication Data

US 2013/0234762 A1    Sep. 12, 2013

(51) Int. Cl.
*H03K 19/02* (2006.01)

(52) U.S. Cl.
USPC .......................................... 326/135; 977/734

(58) Field of Classification Search
USPC .................. 326/135; 327/537; 257/24, 39, 257/E29.264; 438/197; 977/734
See application file for complete search history.

(56) References Cited

U.S. PATENT DOCUMENTS

| | | |
|---|---|---|
| 2009/0174435 A1 | 7/2009 | Stan et al. |
| 2010/0127243 A1 | 5/2010 | Banerjee et al. |
| 2010/0214012 A1 * | 8/2010 | Raza ............................. 327/537 |
| 2010/0284156 A1 | 11/2010 | Tour et al. |
| 2011/0108806 A1 | 5/2011 | Davidovic et al. |
| 2011/0149670 A1 | 6/2011 | Heo et al. |
| 2012/0273763 A1 * | 11/2012 | Banerjee et al. ................ 257/39 |

OTHER PUBLICATIONS

Robert M. Metzger, "Unimolecular electronics", Jun. 23, 2008, J. Mater, Chem., 2008, 18, 4364-4396.*
S. Kim et al., "Realization of a high mobility dual-gated graphene field- effect transistor with Al2O3 dielectric," Appl. Phys. Lett., Applied Physics Letters, vol. 94, Issue 6, Feb. 2009, 062107, 3 pages.
S.-J. Han et al., "Study of channel length scaling in large-scale graphene FETs," 2010 Symposium on VLSI Technology (VLSIT), 2010, pp. 231-232.
Y.-M. Lin et al.,"100-GHz Transistors from Wafer-Scale Epitaxial Graphene," Science, vol. 327 No. 5966, Feb. 5, 2010, p. 662.
H. Ren et al., "Graphene nanoribbon as a negative differential resistance device," Appl. Phys. Lett., vol. 94, 2009,173110, 3 pages.
Z. F. Wang et al., "Emerging nanodevice paradigm: Graphene-based electronics for nanoscale computing," ACM Journal on Emerging Technologies in Computing Systems, vol. 5, No. 1, Jan. 2009, Article 3, 19 pages.
K. M. M. Habin et al., "Negative differential resistance in bilayer graphene nanoribbons," Appl. Phys. Lett. vol. 98, 2011, 192112, 3 pages.

* cited by examiner

*Primary Examiner* — Daniel D Chang
(74) *Attorney, Agent, or Firm* — Vazken Alexanian; McGinn IP Law Group, PLLC

(57) ABSTRACT

A circuit includes a negative differential resistance (NDR) device which includes a gate and a graphene channel, and a gate voltage source which modulates a gate voltage on the gate such that an electric current through the graphene channel exhibits negative differential resistance.

24 Claims, 8 Drawing Sheets

CIRCUIT INCLUDING A NEGATIVE DIFFERENTIAL RESISTANCE (NDR) DEVICE HAVING A GRAPHENE CHANNEL, AND METHOD OF OPERATING THE CIRCUIT

STATEMENT OF GOVERNMENT INTEREST

This invention was made with Government support under Contract No. FA8650-08-C-7838 awarded by Defense Advanced Research Projects Agency (DARPA). The Government has certain rights in this invention.

BACKGROUND OF THE INVENTION

1. Field of the Invention

The present invention relates generally to a circuit including a negative differential resistance (NDR) device, and more particularly, to a circuit including an NDR device which includes a graphene channel.

2. Description of the Related Art

Negative differential resistance (NDR) is a unique property of some electrical circuits where an increase in the current entering a port results in a decreased voltage across the same port. This is in contrast to most electrical components with a positive resistance, which exhibit monotonically increasing electrical currents when the voltage is raised across the electrical ports.

Devices exhibiting negative resistance are particularly useful for applications at microwave frequencies. Negative resistivity is also essential and important in modern electrical applications, such as amplifiers, oscillators, mixers and impedance cancellation.

In contrast to a normally positive resistive device that dissipates energy, an element with negative resistance would generate energy when passing electrical currents. Therefore, absolute negative resistance does not theoretically exist as a discrete component.

In practice, NDR can be achieved in some diodes (e.g. tunneling diodes) in some part of their operating range. NDR can also be obtained in a sophisticated and controlled circuitry, such as an operational amplifier with properly designed feedback.

However, such NDR devices or circuits are typically built as standalone or independent components, and cannot be easily integrated with the rest of the circuits using wafer-scale fabrication processes. This is a problem because such on-chip circuit integration is advantageous and important in order to improve the operating performance (e.g. frequency) and lower the manufacturing cost.

SUMMARY OF THE INVENTION

In view of the foregoing and other problems, disadvantages, and drawbacks of the aforementioned conventional systems and methods, an exemplary aspect of the present invention is directed to a circuit which includes a negative differential resistance (NDR) device which includes a gate and a graphene channel.

Conventional NDR devices or circuits are typically built as standalone or independent components, and cannot be easily integrated with the rest of the circuits using wafer-scale fabrication processes. This is a problem because such on-chip circuit integration is advantageous and important in order to improve the operating performance (e.g. frequency) and lower the manufacturing cost.

An exemplary aspect of the present invention is directed to a circuit which includes a negative differential resistance (NDR) device which includes a gate and a graphene channel, and a gate voltage source which modulates a gate voltage on the gate such that an electric current through the graphene channel exhibits negative differential resistance.

Another exemplary aspect of the present invention is directed to a method of operating a circuit which includes a negative differential resistance (NDR) device which includes a gate and a graphene channel, and a gate voltage source. The method includes modulating a gate voltage on the gate such that an electric current through the graphene channel exhibits negative differential resistance.

Another exemplary aspect of the present invention is directed to a circuit including a negative differential resistance (NDR) device including a gate, a graphene channel including a carrier mobility in a range from 100 (cm$^2$/Vs) to 1 million (cm$^2$/Vs), a gate dielectric contacting the gate and including a thickness in a range from 0.5 nm to 50 nm and a dielectric constant in a range from 2 to 50, the graphene channel contacting the gate dielectric, and source and drain electrodes contacting the gate dielectric and the graphene channel. The circuit also includes a gate voltage source which modulates a gate voltage on the gate such that an electric current through the graphene channel exhibits negative differential resistance, and a bias voltage source which modulates a bias voltage between the source and drain electrodes. The bias voltage includes a range of bias voltages, and the gate voltage source modulates the gate voltage on the gate such that the electric current through the graphene channel exhibits negative differential resistance over the range of bias voltages, and the gate voltage source modulates the gate voltage such that the gate voltage satisfies the following:

$$V_G^2 > 8\left(\frac{\sigma_{min}}{C\cdot\mu}\right)^2 \qquad \text{Eq. (5)}$$

where:
$\sigma_{min}$ is a minimum conductivity of the graphene channel of the NDR device;
C is a capacitance of the gate; and
$\mu$ is a mobility of carriers in the graphene channel.

Another exemplary aspect of the present invention is directed to a method of operating a circuit which includes a negative differential resistance (NDR) device which includes a gate and a graphene channel, and a gate voltage source. The method includes modulating a gate voltage on the gate such that an electric current through the graphene channel exhibits negative differential resistance. The NDR device further includes a gate dielectric contacting the gate, the graphene channel contacting the gate dielectric, and source and drain electrodes contacting the gate dielectric and the graphene channel, a thickness of the gate dielectric is in a range from 0.5 nm to 50 nm, a dielectric constant of the gate dielectric is in a range from 2 to 50, and a carrier mobility of the graphene channel is in a range from 100 (cm$^2$/Vs) to 1 million (cm$^2$/Vs), the circuit further includes a bias voltage source which modulates a bias voltage between the source and drain electrodes, the bias voltage includes a range of bias voltages, and the gate voltage source modulates the gate voltage on the gate such that the electric current through the graphene channel exhibits negative differential resistance over the range of bias voltages, and the gate voltage source modulates the gate voltage such that the gate voltage satisfies the following:

$$V_G^2 > 8\left(\frac{\sigma_{min}}{C \cdot \mu}\right)^2 \qquad \text{Eq. (5)}$$

where:
    $\sigma_{min}$ is a minimum conductivity of the graphene channel of the NDR device;
    C is a capacitance of the gate; and
    μ is a mobility of carriers in the graphene channel.

With its unique and novel features, the present invention may provide a circuit which can more easily integrate an NDR device using wafer-scale fabrication processes, than conventional circuits.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1:
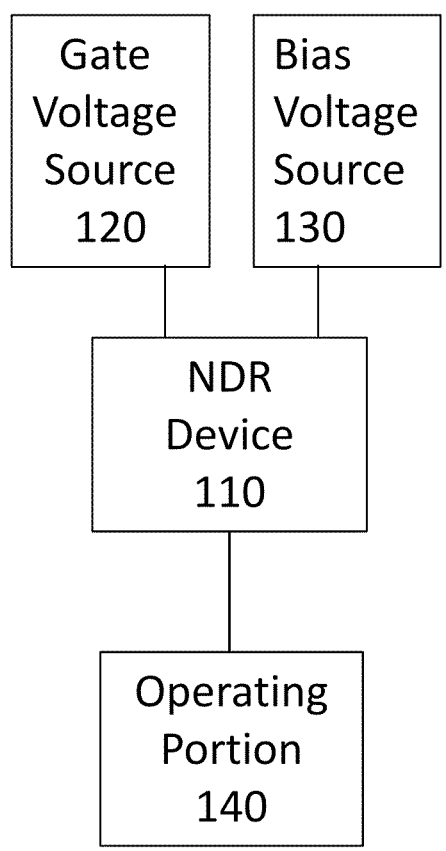
FIG. 1 illustrates a block diagram of a circuit 100 including a negative differential resistance (NDR) device 110, according to an exemplary aspect of the present invention.

Referring now to the drawings, FIGS. 1-11 illustrate some of the exemplary aspects of the present invention.

FIG. 1 illustrates a block diagram of a circuit 100 including a negative differential resistance (NDR) device 110, according to an exemplary aspect of the present invention. The circuit also includes a gate voltage source 120 which modulates a gate voltage on a gate of the NDR device 110 such that an electric current through a graphene channel of the NDR device 110 exhibits negative differential resistance.

As illustrated in FIG. 1, the circuit 100 may also include a bias voltage source 130 which modulates a bias voltage between source and drain electrodes of the NDR device 110. In particular, the bias voltage may include a range of bias voltages, and the gate voltage source 120 may modulate the gate voltage on the gate of the NDR device 110 such that the electric current through the graphene channel of the NDR device 110 exhibits negative differential resistance over the range of bias voltages.

In an exemplary aspect, the gate voltage source 120 may modulate the gate voltage on the gate to be in a range from −10V to 10V, and the bias voltage source 130 may modulate the bias voltage between the source and drain electrodes to be in a range from −10V to 10V.

The circuit 100 may also include (e.g., be electrically coupled to) an operating portion 140 having features (e.g., characteristics) which are to be affected by the NDR device 110. In particular, the operating portion 140 may be connected to the source and drain electrodes 118a, 118b of the NDR device 110.

For example, if the circuit 110 is an oscillator circuit, then the operating portion 140 may include a load is connected to the NDR device 110 (e.g., connected to source and drain electrodes 118a, 118b of the NDR device 110). As a result, a resistance of the load may be canceled out by the NDR device 110, so that there is substantially no resistance in the circuit 100 so that the circuit 100 can sustain a resonant frequency.

Figure 2A:
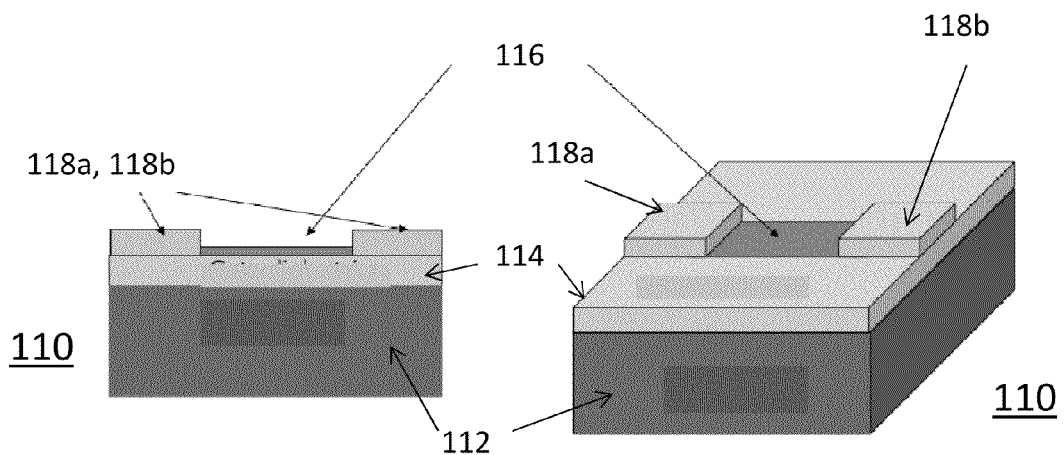
FIG. 2A illustrates the NDR device 110 having a back-gate configuration, according to an exemplary aspect of the present invention.
Figure 2B:
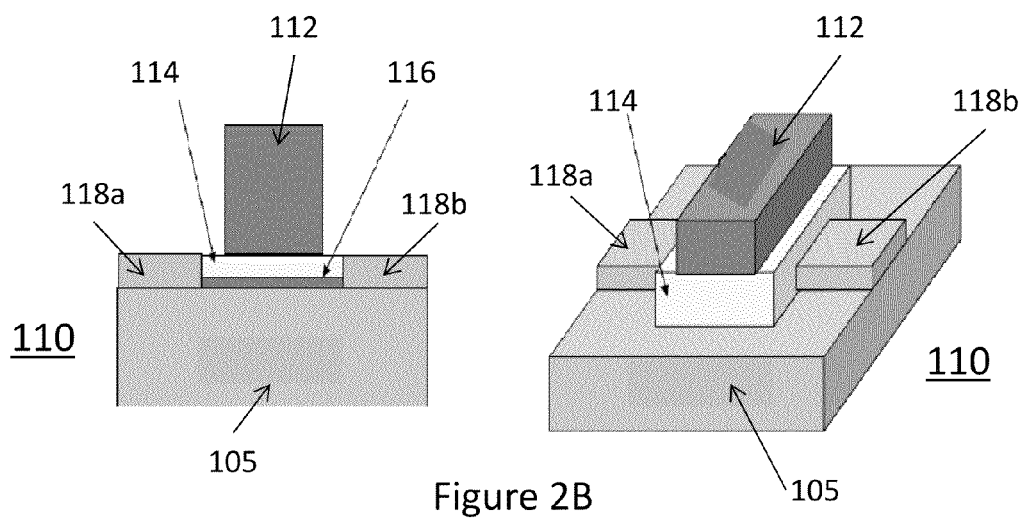
FIG. 2B illustrates the NDR device 110 having a front-gate configuration, according to an exemplary aspect of the present invention.

FIGS. 2A and 2B provide a more detailed illustration of the NDR device 110, according to exemplary aspects of the present invention. In particular, FIG. 2A illustrates the NDR device 110 having a back-gate configuration, and FIG. 2B illustrates the NDR device 110 having a front-gate configuration.

As illustrated in FIG. 2A, the NDR device 110 having a back-gate configuration includes a gate 112, a gate dielectric 114 contacting the gate 112 (e.g., formed on an upper surface of the gate 112), a graphene channel 116 contacting the gate dielectric 114 (e.g., formed on an upper surface of the gate dielectric 114), and source and drain electrodes 118a, 118b (e.g., metal contacts) contacting the gate dielectric 114 (e.g., formed on a surface of the gate dielectric 114) and the graphene channel 116 (e.g., contacting a side surface of the graphene channel 116).

As illustrated in FIG. 2B, the NDR device 110 having a front-gate configuration includes a graphene channel 116 formed on a substrate 105 (e.g., formed on an upper surface of the substrate 105) such as an SiC substrate, a gate dielectric 114 formed on the graphene channel 116 (e.g., formed on an upper surface of the graphene channel 116), source and drain electrodes 118a, 118b (e.g., metal contacts) formed on the substrate 105 and contacting the graphene channel 116 and the gate dielectric 114 (e.g., contacting a side surface of the graphene channel 116 and a side surface of the gate dielectric 114), and a gate 112 formed on the gate dielectric 114 (e.g., formed on an upper surface of the gate dielectric 114).

It should be noted that FIGS. 2A and 2B are merely illustrative and should not be considered as limiting the NDR device 110 of the present invention to any particular structure or configuration.

The circuit 100 includes an NDR device 100 which may be based on graphene, which can allow the NDR device 100 to be readily integrated with existing microelectronics (e.g., semiconductor microelectronics). In principle, the NDR device 100 can achieve better performance and higher operating frequencies (e.g., microwave frequencies).

Graphene is layer of carbon atoms arranged in a hexagonal network, where carbon atoms are bonded by sp2 hybridization. Graphene possesses great potential for high-speed electronics because of its high carrier mobility and the ultra-thin body thickness, which is only one atom layer thin.

High-frequency operation of graphene-based field-effect transistors, beyond 100 GHz, has been recently demonstrated. However, conventional circuits do not include graphene-based NDR devices (e.g., NDR devices including graphene channels).

In view of the excellent electrical properties of graphene and minimal parasitics associated with a relatively simple design, a circuit according to the exemplary aspects of the present invention includes a graphene-based NDR device which is may be expected to possess superior performance at very high frequencies compared to conventional circuits including other types of NDR devices.

The exemplary aspects of the present invention may include an optimum (e.g., preferred) operating range and an optimum (e.g., preferred) operating condition for the NDR device 110.

As noted above with respect to FIGS. 2A and 2B, the NDR device 110 may include a field-effect device having three terminals: a gate 112, and source and drain electrodes 118a, 118b. The source and drain electrodes 118a, 118b may be contacted directly with graphene, and the gate 112 may be separated from the graphene channel 116 by a thin layer of insulating dielectrics 114.

The graphene channel 114 may include one or more layers of graphene, and the conduction of the graphene layer(s) can be modulated by the gate 112. Therefore, the circuit 100 may modulate the voltage (e.g., gate voltage) on the gate 112, such that the electrical current through the graphene channel 116 may exhibit negative differential resistance for a range of source-drain biases. That is, the circuit 100 may be able to "tune" the characteristics of the NDR device 110 by modulating the gate voltage on the gate 112, and by modulating the bias voltage on the source and drain electrodes 118a, 118b.

The circuit 100 including the NDR device 110 may provide several advantages. First, compared to conventional NDR circuits that employ sophisticated feedback circuits, the circuit 100 may include only one basic component, may possess much smaller parasitics, and thus, may allow for higher performance than conventional circuits. Second, the planar structure of graphene makes it compatible with wafer-scale processes and may help to facilitate integration with existing semiconductor (e.g., silicon) microelectronics. Third, the circuit 100 may conveniently control the characteristics of the NDR device 110 can using the gate voltage (e.g., gate voltage and bias voltage) which may provide flexibility in design of the circuit 100.

The NDR device 110 may be fabricated by a method which is similar to a method of fabricating a graphene field-effect transistor. For example, the graphene channel 116 in the NDR device 110 may include one or more graphene layers which can be epitaxially grown on a substrate (e.g., SiC substrate), or grown by chemical vapor deposition, or produced elsewhere and transferred to the desired substrate. The channel defined by lithography, where excess graphene are removed by oxygen plasma. In the top-gate configuration shown in FIG. 2B, a layer of insulator is deposited as the gate dielectrics, followed by the formation of gate electrodes.

The source and drain electrodes 118a, 118b may include a layer of metal which may be deposited on a substrate (e.g., the back gate 112 in FIG. 2A or the substrate 105 in FIG. 2B) using lithography and lift-off techniques.

In an exemplary aspect, the gate dielectrics may include at least one of aluminum oxide, hafnium oxide, silicon oxide, yttrium oxide, zirconium oxide, SrO, CaO, HfSiO$_4$ and ZrSiO$_4$. Different from graphene field-effect transistors, the use of high-k and thin gate dielectrics is essential and advantageous for the operation of graphene NDR devices.

Figure 3:
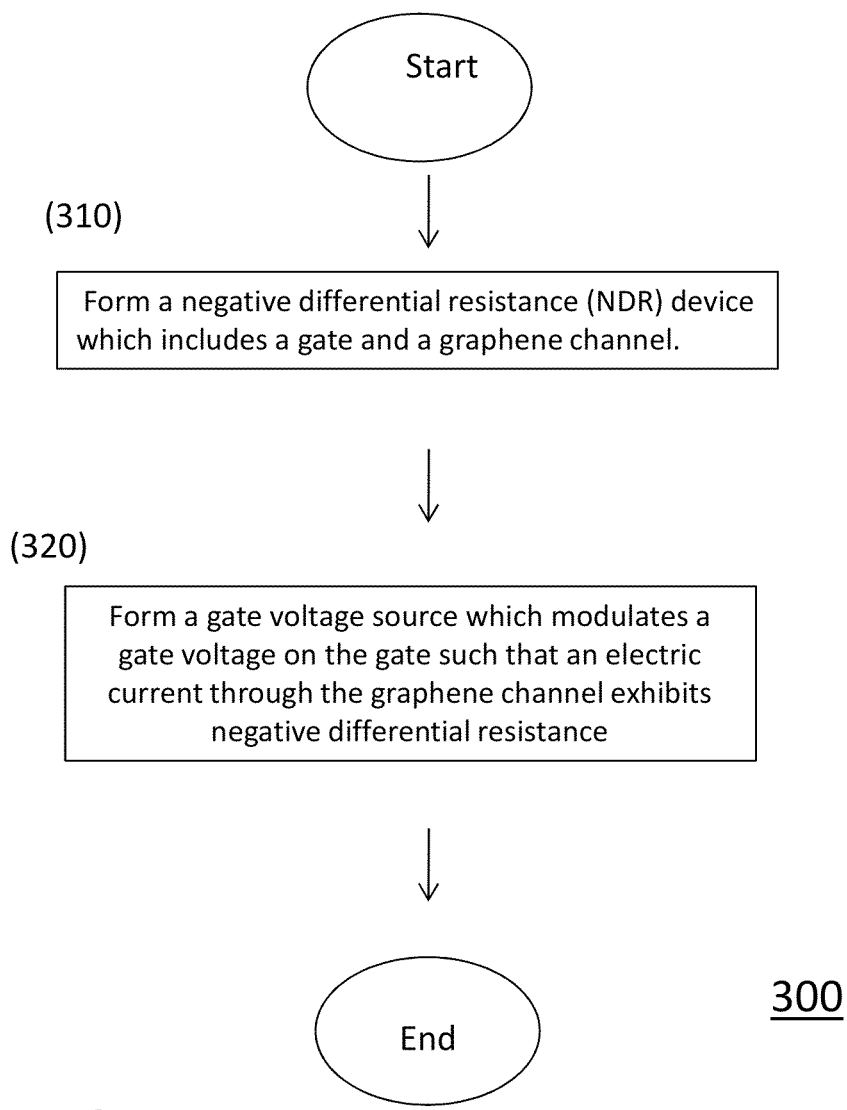
FIG. 3 illustrates a method 300 of making a circuit, according to an exemplary aspect of the present invention.

Referring again to the drawings, FIG. 3 illustrates a method 300 of making a circuit, according to an exemplary aspect of the present invention.

As illustrated in FIG. 3, the method 300 includes forming (310) a negative differential resistance (NDR) device which includes a gate and a graphene channel, and forming (320) a gate voltage source which modulates a gate voltage on the gate such that an electric current through the graphene channel exhibits negative differential resistance. In particular, the method 300 may include a wafer-scale process in which the forming (310) of the NDR device includes integrally forming the NDR device with other features on a silicon wafer. In particular, the forming (310) of the NDR device may include one or more lithographic steps (e.g., steps such as masking and etching a silicon wafer and/or layers formed on the silicon wafer) which are also used to form other features (e.g., microelectronic features) of the circuit.

For example, if the circuit includes an operating portion (e.g., operating portion 140 in FIG. 1) having features (e.g., characteristics) which are to be affected by the NDR device, then the forming (310) of the NDR device may include one or more lithographic steps which are also used to form the operating portion. Thus, if the circuit is an oscillator circuit, then the forming (310) of the NDR device may include one or more lithographic steps which are also used to form the load having a resistance which is canceled out by the NDR device.

Figure 4:
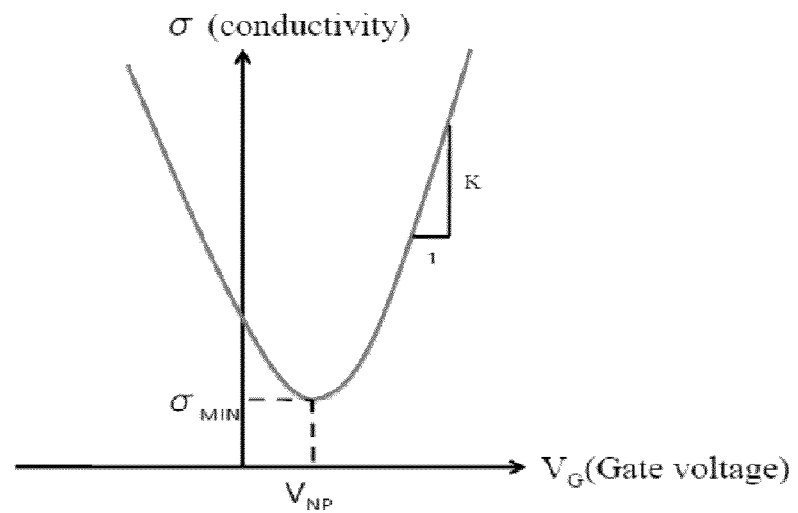
FIG. 4 provides a graph illustrating characteristics of the NDR device 110, according to an exemplary aspect of the present invention.

Referring again to the drawings, FIG. 4 provides a graph illustrating characteristics of the NDR device 110, according to an exemplary aspect of the present invention. In particular, the graph includes plot of gate voltage on the gate 112 vs. conductivity of the graphene channel 116. As illustrated in FIG. 4, the plot may include ambipolar characteristics which result from the fact that graphene has zero band gap and possesses symmetric band structures for electrons and holes.

Important features of the plot of graphene channel conductivity as a function of gate voltage in FIG. 4 include (1) the minimum conductivity ($\sigma_{rain}$), (2) the gate voltage (VNP) corresponding to the minimum conductivity ($\sigma_{min}$), and (3) the slope factor K which is proportional to the capacitance of the gate 112 and the carrier mobility of the graphene channel 116.

Using these three parameters, the dependence of the conductivity ($\sigma$) of the graphene channel 116 on the gate 112 can be phenomenologically described by Equation (1) below:

$$\sigma = K\left[(V_G - V_{NP})^2 + \left(\frac{\sigma_{min}}{K}\right)^2\right]^{1/2} \qquad \text{Eq. (1)}$$

where K is a slope factor which is given by K=C·µ (C being a capacitance of the gate 112, and µ being a mobility of carriers in the graphene channel 116), $V_G$ is the gate voltage, and $\sigma_{min}$ is a minimum conductivity of the graphene channel 116.

Further, $V_{NP}$ is the gate voltage corresponding to the minimum conductivity of the graphene channel 116, and is given by: $V_{NP}=V_{NP}^0+V_{DS}/2$, where $V_{DS}$ is bias voltage on the source and drain electrodes 118a, 118b, and $V_{NP}^0$ is a gate voltage of minimal current when $V_{DS}$ approaches zero. That is, for a well-behaved graphene field-effect NDR device, where the graphene channel 116 is controlled by gate electrostatics, $V_{NP}$ may be dependent on the bias voltage, $V_{DS}$, of the source-drain electrodes 118a, 118b. This is because the electron and hole currents are always equal at the current minimum, and this condition is met only when the change of $V_{NP}$ is equal to half of the increased bias voltage, $V_{DS}$. This "drain-dependent" $V_{NP}$ is unique to graphene field-effect devices (e.g., NDR device 110).

Figure 5:
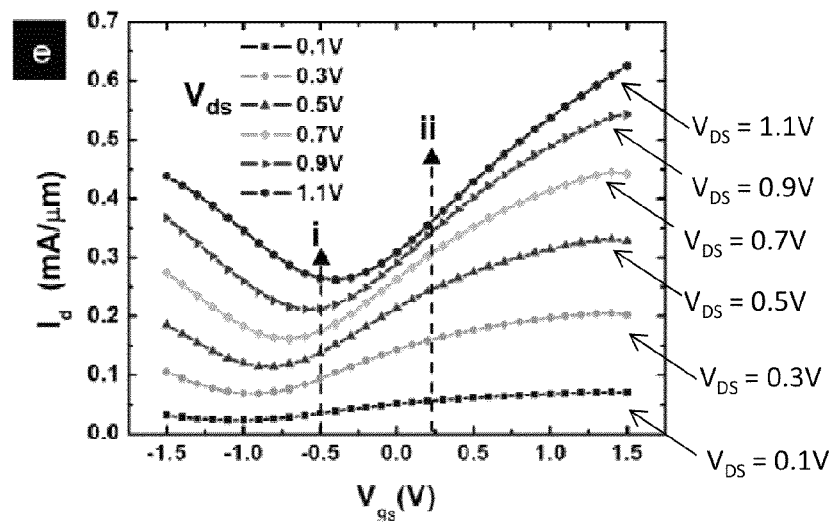
FIG. 5 provides a graph that plots results of some experiments conducted with the NDR device 110 for a plurality of bias voltages (e.g., drain bias voltages), according to an exemplary aspect of the present invention.

FIG. 5 provides a graph that plots results of some experiments conducted with the NDR device 110 for a plurality of bias voltages (e.g., drain bias voltages), according to an exemplary aspect of the present invention. In particular, the graph plots drain current, $I_d$ (mA/μm) vs. gate voltage, $V_G$, (V) for the NDR device 110, for $V_{DS}$ equal to 0.1V, 0.3V, 0.5V, 0.7V, 0.9V and 1.1V.

In FIG. 5, the region from the vertical line marked "i" in the graph to the vertical line marked "ii" is the "negative differential resistance region" in which the graphene channel 116 exhibits a negative differential resistance.

Figure 6:
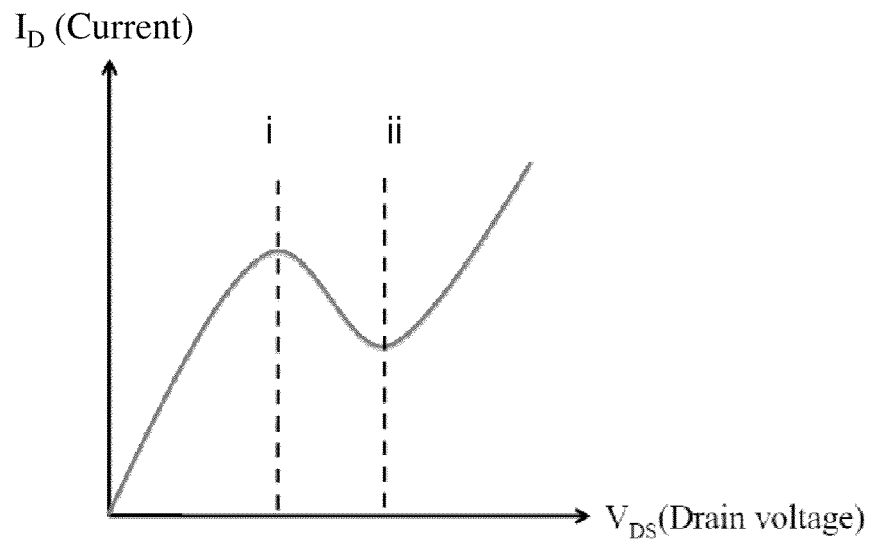
FIG. 6 illustrates current-voltage characteristics of the NDR device 110, according to an exemplary aspect of the present invention.

FIG. 6 illustrates current-voltage characteristics of the NDR device 110, according to an exemplary aspect of the present invention. In particular, the graph in FIG. 6 is a plot of drain current, $I_D$, vs. bias voltage, $V_{DS}$ (e.g., drain voltage).

Further, in FIG. 6, the NDR region (i.e., the region from the vertical line marked "i" in the graph to the vertical line marked "ii") is characterized by a negative output conductance, $g_{DS}$, which may be defined as a derivative of drain current, $I_D$, with respect to bias voltage, $V_{DS}$. That is, in the NDR region, it may be said that $$g_{DS} = \frac{dI}{dV_{DS}} < 0.$$

Figure 7:
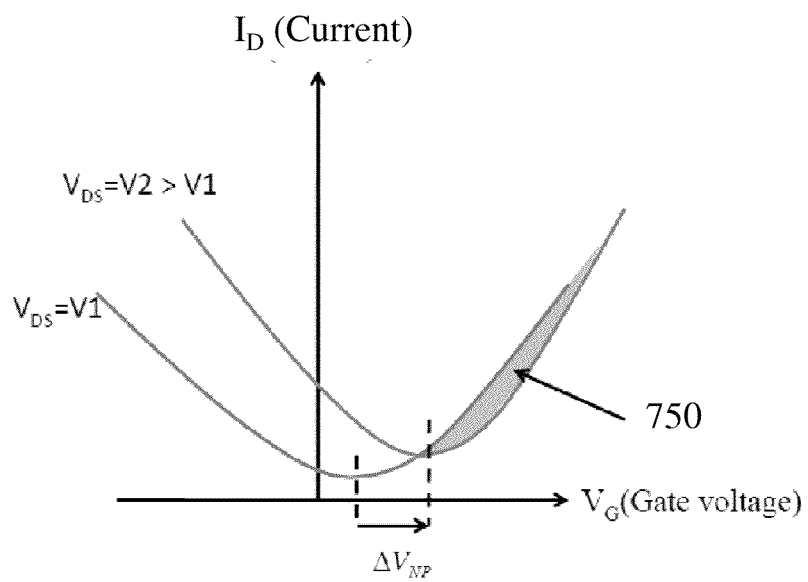
FIG. 7 provides a graph illustrating the negative differential resistance behavior of the NDR device 110, according to an exemplary aspect of the present invention.

FIG. 7 provides a graph illustrating the negative differential resistance behavior of the NDR device 110, according to an exemplary aspect of the present invention.

In particular, FIG. 7 illustrates the drain current, $I_D$, as a function of gate voltage, $V_G$, for two different bias voltages (e.g., drain voltages), V1 and V2, where V2>V1. As discussed above, the point of minimum current (e.g., the point of minimum conductivity of the graphene channel 116) will shift by (V2−V1)/2 (i.e., $\Delta V_{NP}$=(V2−V1)/2) when $V_{DS}$ increases. Therefore, there exists a region where the current, $I_D$, for $V_{DS}$=V2 becomes less than the current, $I_D$, for $V_{DS}$=V1, yielding a "negative differential resistance region" which is the shaded region 750 between the two curves in FIG. 7.

A more quantitative analysis of the behavior of the NDR device 110 is given in Equations 3, 4 and 5, below.

$$g_{DS} = \frac{dI}{dV_{DS}} = \frac{K \cdot W}{L} \left\{ \frac{(V_{DS}-V_G)\left(\frac{1}{2}V_{DS}-V_G\right)+\left(\frac{\sigma_{min}}{K}\right)^2}{\sqrt{\left(V_G-\frac{1}{2}V_{DS}\right)^2+\left(\frac{\sigma_{min}}{K}\right)^2}} \right\} \quad \text{Eq. (3)}$$

$$g_{DS} < 0 \text{ when } (V_{DS}-V_G)\left(\frac{1}{2}V_{DS}-V_G\right)+\left(\frac{\sigma_{min}}{K}\right)^2 < 0 \quad \text{Eq. (4)}$$

Or equivalently, $$\frac{3}{2}V_G - \sqrt{\frac{1}{4}V_G^2 - 2\left(\frac{\sigma_{min}}{K}\right)^2} < V_{DS} < \frac{3}{2}V_G + \sqrt{\frac{1}{4}V_G^2 - 2\left(\frac{\sigma_{min}}{K}\right)^2}$$

Necessary condition for (2) to exist is $V_G^2 > 8\left(\frac{\sigma_{min}}{C \cdot \mu}\right)^2$ Eq. (5)

In particular, an explicit expression of the output conductance, $g_{DS}$, is derived as Equation (3), where W is channel width for the graphene channel, and L is channel length for the graphene channel. Equation (4) shows the bias conditions for negative differential resistance where the output conductance, $g_{DS}$, become negative.

Equation (5) provides some conditions (e.g., preferred conditions) for NDR device 110, according to an exemplary aspect of the present invention. From Equation (5), it can be seen that it may be advantageous to have (1) a small minimum conductivity, $\sigma_{min}$, (2) a large gate capacitance for the gate 112, and (3) a high mobility in the graphene channel 116, so that the NDR device 110 can operate in a smaller range of gate voltages, $V_G$.

In an exemplary aspect, the gate dielectric may include high-dielectric materials such as aluminum oxide, hafnium oxide, silicon oxide, yttrium oxide and zirconium oxide, SrO, CaO, HfSiO$_4$ and ZrSiO$_4$. In another exemplary aspect, the preferred range of the dielectric constant for the gate dielectric is in a range from 2 to 50. In another exemplary aspect, the preferred range of dielectric constant for the gate dielectric is in a range from 11 to 15.

In an exemplary aspect of the present invention, the preferred range of carrier mobility is in a range from 100 (cm$^2$/Vs) to 1 million (cm$^2$/Vs). In another exemplary aspect, the preferred range of carrier mobility is in a range from 1000 (cm$^2$/Vs) to 1 million (cm$^2$/Vs). In another exemplary aspect, the preferred range of carrier mobility is in a range from 10000 (cm$^2$/Vs) to 1 million (cm$^2$/Vs).

In the NDR device 110, the range of operating gate voltages on the gate 112 may be determined largely by the thickness of the dielectric material (e.g., high-k gate dielectric material) in the gate dielectric 114. For the NDR device 110 to operate in the range of NDR, the output conductivity, $g_{DS}$, must be less than 0. The gate voltage required to achieve such a condition increases with increasing thickness of the gate dielectric 114.

Therefore, for the NDR device 110 to be operationally practical, the thickness of the gate dielectric 114 should be small. For example, in an exemplary aspect of the present invention, the preferred range of gate dielectric thickness is 0.5 nm to 50 nm. In another exemplary aspect, the preferred range of gate dielectric thickness is 4 nm to 20 nm.

Figure 8:
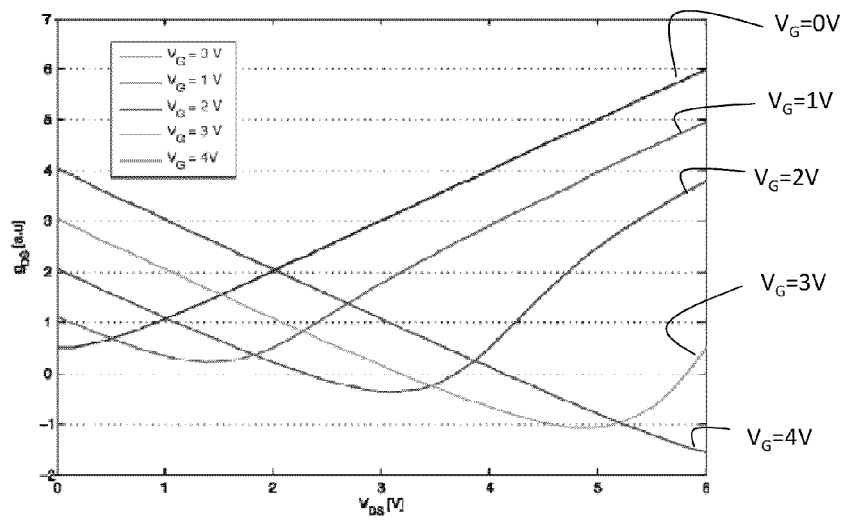
FIG. 8 illustrates output conductance, $g_{DS}$, (e.g., modeled output conductance) as a function of drain voltage, $V_{DS}$, for different gate voltages (e.g., $V_G$=0V, 1V, 2V, 3V and 4V), assuming $\sigma_{min}/K$=0.5, in the NDR device 110, according to an exemplary aspect of the present invention.

FIG. 8 illustrates output conductance, $g_{DS}$, (e.g., modeled output conductance) as a function of drain voltage, $V_{DS}$, for different gate voltages (e.g., $V_G$=0V, 1V, 2V, 3V and 4V), assuming $\sigma_{min}/K$=0.5, in the NDR device 110, according to an exemplary aspect of the present invention. In particular, FIG. 8 was obtained by plotting $g_{DS}$ using Equation (3) above, where the values of W and L were both 1 mm.

Figure 9:
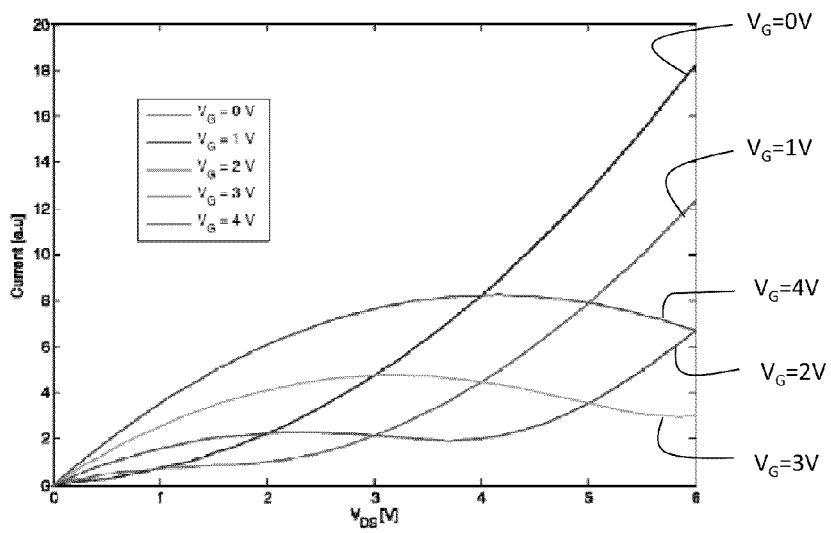
FIG. 9 shows the Corresponding drain current, $I_D$, as a function of drain voltage, $V_{DS}$, for different gate voltages (e.g., $V_G$=0V, 1V, 2V, 3V and 4V), in the NDR device 110, according to an exemplary aspect of the present invention.

FIG. 9 shows the corresponding drain current, $I_D$, as a function of drain voltage, $V_{DS}$, for different gate voltages (e.g., $V_G$=0V, 1V, 2V, 3V and 4V), in the NDR device 110, according to an exemplary aspect of the present invention.

The results of FIG. 8 and FIG. 9 show that negative differential resistance in the NDR device 110 can be obtained and tuned by controlling the gate voltage, $V_G$, on the gate 112, and by controlling the bias voltage, $V_{DS}$ (e.g., drain voltage) on the source and drain electrodes 118a, 118b.

Figure 10:
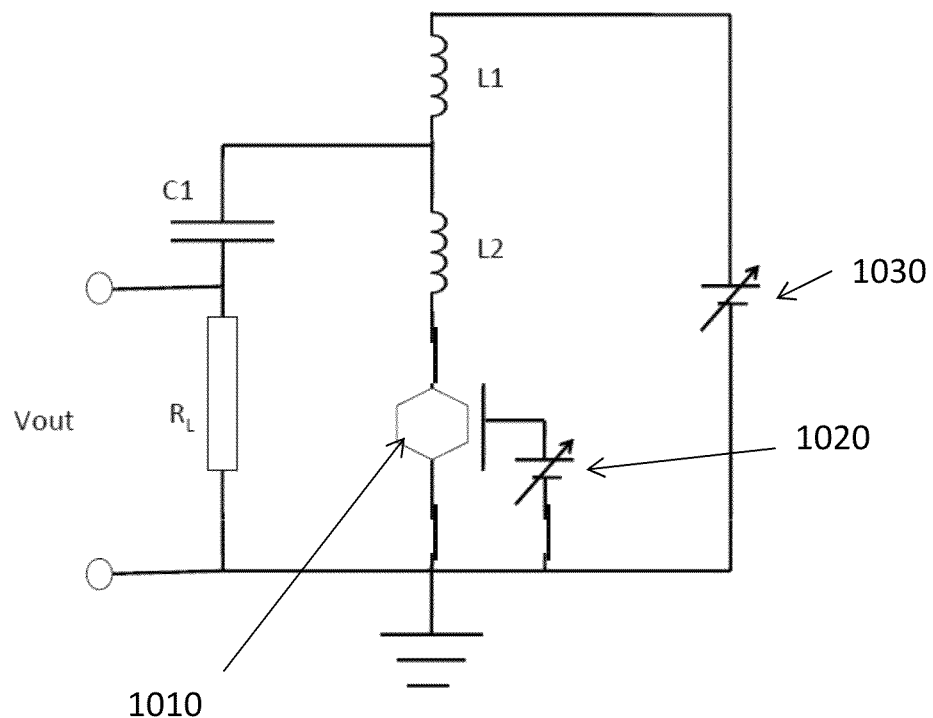
FIG. 10 illustrates a circuit 1000 including an NDR device 1010, according to an exemplary aspect of the present invention.

FIG. 10 illustrates a circuit 1000 including an NDR device 1010, according to an exemplary aspect of the present invention. The circuit 1000 may include, for example, an oscillator circuit which is capable of producing high-frequency signals.

As illustrated in FIG. 10, the circuit 1000 includes the NDR device 1010 which may be similar in structure and function to NDR device 110 described above. The circuit 1000 may also include inductors L1 and L2 which may include the parasitics from the cables and interconnects. The circuit 1000 may also include a capacitance C1 and load resistance $R_L$ which may also include a contribution from the parasitics.

The circuit 1000 may also include gate voltage source 1020 which is connected to the gate of the NDR device 1010, and applies a gate voltage, $V_G$, to the gate.

The circuit 1000 may also include voltage source 1030 which is connected to the source and drain electrodes of the NDR device 1010, and applies a bias voltage, $V_{bias}$ to the source and drain electrodes of the NDR device 1010.

The circuit 1000 may also include output terminals 1090 for outputting a voltage, $V_{out}$, from the circuit 100.

As illustrated in FIG. 10, the load resistance, $R_L$, is connected to the NDR device 110 (e.g., connected to source and drain electrodes 118a, 118b of the NDR device 110). As a result, the load resistance, $R_L$, may be canceled out by the NDR device 110, so that there is substantially no resistance in the circuit 1000 so that the circuit 1000 can sustain a resonant frequency.

Figure 11:
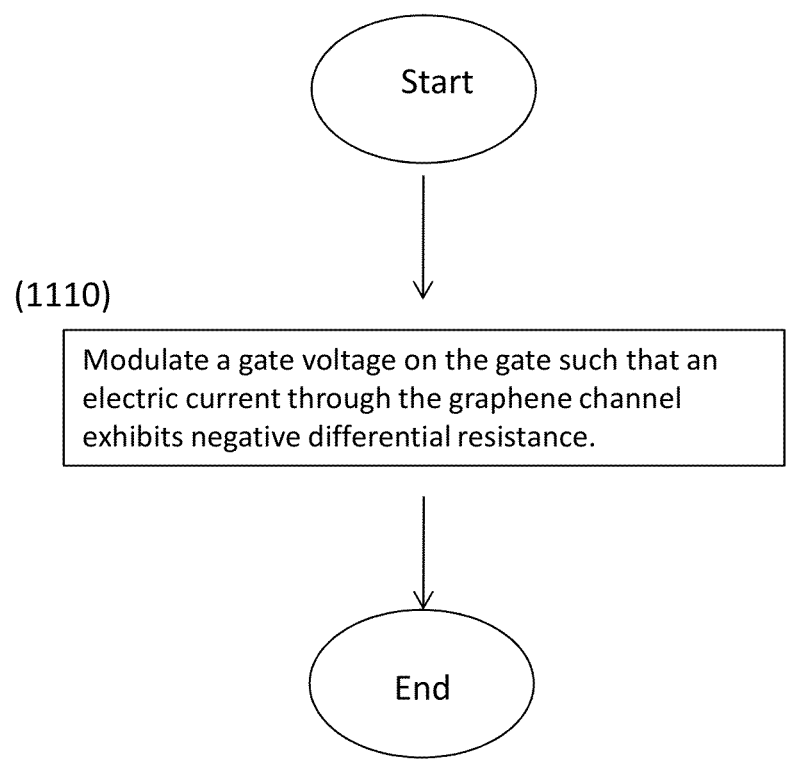
FIG. 11 illustrates a method 1100 of operating a circuit which includes a negative differential resistance (NDR) device which includes a gate and a graphene channel, and a gate voltage source, according to an exemplary aspect of the present invention.

FIG. 11 illustrates a method 1100 of operating a circuit which includes a negative differential resistance (NDR) device which includes a gate and a graphene channel, and a gate voltage source, according to an exemplary aspect of the present invention. The method includes modulating (1110) a gate voltage on the gate such that an electric current through the graphene channel exhibits negative differential resistance.

As noted above with respect to the NDR device 110, in the method 1100, the NDR device may also include a gate dielectric contacting the gate, the graphene channel contacting the gate dielectric, and source and drain electrodes contacting the gate dielectric and the graphene channel. Further, the circuit may further include a bias voltage source, and the method 1100 may further include modulating a bias voltage between the source and drain electrodes, by using the bias voltage source.

With its unique and novel features, the present invention may provide a circuit which can more easily integrate an NDR device using wafer-scale fabrication processes, than conventional circuits.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A circuit comprising:
    a first circuit portion including a resistance; and
    a second circuit portion including:
        a three-terminal negative differential resistance (NDR) device which includes a gate, a graphene channel and source and drain electrodes contacting the graphene channel; and
        a gate voltage source which modulates a gate voltage on the gate such that an electric current through the graphene channel exhibits negative differential resistance which cancels out at least a portion of the resistance of the first circuit portion.

2. The circuit of claim 1, wherein the NDR device further comprises:
    a gate dielectric contacting the gate, the graphene channel contacting the gate dielectric,
    wherein the source and drain electrodes contact the gate dielectric.

3. The circuit of claim 2, further comprising:
    a bias voltage source which modulates a bias voltage between the source and drain electrodes.

4. The circuit of claim 3, wherein the bias voltage comprises a range of bias voltages, and the gate voltage source modulates the gate voltage on the gate such that the electric current through the graphene channel exhibits negative differential resistance over the range of bias voltages.

5. The circuit of claim 3, wherein the gate voltage source modulates the gate voltage on the gate to be in a range from −10V to 10V.

6. The circuit of claim 3, wherein the bias voltage source modulates the bias voltage between the source and drain electrodes to be in a range from −10V to 10V.

7. The circuit of claim 3, wherein the gate voltage source modulates the gate voltage such that the gate voltage satisfies the following:

$$V_G^2 > 8\left(\frac{\sigma_{min}}{C \cdot \mu}\right)^2 \qquad \text{Eq. (5)}$$

where:
    $\sigma_{min}$ is a minimum conductivity of the graphene channel of the NDR device;
    C is a capacitance of the gate; and
    $\mu$ is a mobility of carriers in the graphene channel.

8. The circuit of claim 3, wherein a conductivity, $\sigma$, of the graphene channel is given by Equation (1):

$$\sigma = K\left[(V_G - V_{NP})^2 + \left(\frac{\sigma_{min}}{K}\right)^2\right]^{1/2} \qquad \text{Eq. (1)}$$

where:
    K is a slope factor which is given by K=C·$\mu$ (C being a capacitance of the gate, and $\mu$ being a mobility of carriers in the graphene channel);
    $V_G$ is gate voltage;
    $\sigma_{min}$ is a minimum conductivity of the graphene channel; and
    $V_{NP}$ is gate voltage corresponding to the minimum conductivity of the graphene channel, and is given by: $V_{NP}=V_{NP}^0+V_{DS}/2$, where $V_{DS}$ is source-drain bias voltage, and $V_{NP}^0$ is a gate voltage of minimal current when $V_{DS}$ approaches zero.

9. The circuit of claim 8, wherein for $\sigma_{min}/K$=0.5, an output conductance, $g_{DS}$, of the graphene channel is negative.

10. The circuit of claim 2, wherein a thickness of the gate dielectric, a dielectric constant of the gate dielectric and a carrier mobility of the graphene channel are such that the NDR device exhibits a negative differential resistance.

11. The circuit of claim 2, wherein a thickness of the gate dielectric is in a range from 0.5 nm to 50 nm, a dielectric constant of the gate dielectric is in a range from 2 to 50, and a carrier mobility of the graphene channel is in a range from 100 (cm²/Vs) to 1 million (cm²/Vs).

12. The circuit of claim 2, wherein the gate dielectric comprises at least one of aluminum oxide, hafnium oxide, silicon oxide, yttrium oxide and zirconium oxide, SrO, CaO, HfSiO$_4$ and ZrSiO$_4$.

13. The circuit of claim 1, wherein the circuit comprises one of an amplifier circuit, an oscillator circuit, a mixer circuit, an impedance cancellation circuit, a memory circuit and a logic circuit.

14. The circuit of claim 1, wherein the NDR device comprises one of a back gate configuration and a front gate configuration.

15. A method of operating a circuit, the method comprising:
providing a first circuit portion including a resistance, and a second circuit portion including a three-terminal negative differential resistance (NDR) device which includes a gate, a graphene channel and source and drain electrodes contacting the graphene channel,
modulating a gate voltage on the gate such that an electric current through the graphene channel exhibits negative differential resistance which cancels out at least a portion of the resistance of the first circuit portion.

16. The method of claim 15, wherein the NDR device further comprises a gate dielectric contacting the gate, the graphene channel contacting the gate dielectric,
wherein the source and drain electrodes contact the gate dielectric, and the circuit comprises the NDR device, a gate voltage source and a bias voltage source, and
wherein the method further comprises:
modulating a bias voltage between the source and drain electrodes, by using the bias voltage source.

17. The method of claim 16, wherein the bias voltage comprises a range of bias voltages, and the gate voltage source modulates the gate voltage on the gate such that the electric current through the graphene channel exhibits negative differential resistance over the range of bias voltages.

18. The method of claim 15, wherein the gate voltage satisfies the following:

$$V_G^2 > 8\left(\frac{\sigma_{min}}{C \cdot \mu}\right)^2 \qquad \text{Eq. (5)}$$

where:
$\sigma_{min}$ is a minimum conductivity of the graphene channel of the NDR device;
C is a capacitance of the gate; and
$\mu$ is a mobility of carriers in the graphene channel.

19. The method of claim 18, wherein a conductivity, $\sigma$, of the graphene channel is given by Equation (1):

$$\sigma = K\left[(V_G - V_{NP})^2 + \left(\frac{\sigma_{min}}{K}\right)^2\right]^{1/2} \qquad \text{Eq. (1)}$$

where:
K is a slope factor which is given by K=C·$\mu$ (C being a capacitance of the gate, and $\mu$ being a mobility of carriers in the graphene channel);

$V_G$ is gate voltage;
$\sigma_{min}$ is a minimum conductivity of the graphene channel; and
$V_{NP}$ is gate voltage corresponding to the minimum conductivity of the graphene channel, and is given by: $V_{NP}=V_{NP}^0+V_{DS}/2$, where $V_{DS}$ is source-drain bias voltage, and $V_{NP}^0$ is a gate voltage of minimal current when $V_{DS}$ approaches zero.

20. The method of claim 19, wherein for $\sigma_{min}/K$=0.5, an output conductance, $g_{DS}$, of the graphene channel is negative.

21. A circuit comprising:
a negative differential resistance (NDR) device comprising:
a gate;
a graphene channel including a carrier mobility in a range from 100 (cm²/Vs) to 1 million (cm²/Vs);
a gate dielectric contacting the gate and including a thickness in a range from 0.5 nm to 50 nm and a dielectric constant in a range from 2 to 50, the graphene channel contacting the gate dielectric; and
source and drain electrodes contacting the gate dielectric and the graphene channel;
a gate voltage source which modulates a gate voltage on the gate such that an electric current through the graphene channel exhibits negative differential resistance; and
a bias voltage source which modulates a bias voltage between the source and drain electrodes,
wherein the bias voltage comprises a range of bias voltages, and the gate voltage source modulates the gate voltage on the gate such that the electric current through the graphene channel exhibits negative differential resistance over the range of bias voltages, and
wherein the gate voltage source modulates the gate voltage such that the gate voltage satisfies the following:

$$V_G^2 > 8\left(\frac{\sigma_{min}}{C \cdot \mu}\right)^2 \qquad \text{Eq. (5)}$$

where:
$\sigma_{min}$ is a minimum conductivity of the graphene channel of the NDR device;
C is a capacitance of the gate; and
$\mu$ is a mobility of carriers in the graphene channel.

22. The circuit of claim 21, wherein a conductivity, $\sigma$, of the graphene channel is given by Equation (1):

$$\sigma = K\left[(V_G - V_{NP})^2 + \left(\frac{\sigma_{min}}{K}\right)^2\right]^{1/2} \qquad \text{Eq. (1)}$$

where:
K is a slope factor which is given by K=C·$\mu$ (C being a capacitance of the gate, and $\mu$ being a mobility of carriers in the graphene channel);
$V_G$ is gate voltage;
$\sigma_{min}$ is a minimum conductivity of the graphene channel; and
$V_{NP}$ is gate voltage corresponding to the minimum conductivity of the graphene channel, and is given by: $V_{NP}=V_{NP}^0+V_{DS}/2$, where $V_{DS}$ is source-drain bias voltage, and $V_{NP}^0$ is a gate voltage of minimal current when $V_{DS}$ approaches zero.

23. The circuit of claim 22, wherein for $\sigma_{min}/K$=0.5, an output conductance, $g_{DS}$, of the graphene channel is negative.

24. A method of operating a circuit which includes a negative differential resistance (NDR) device which includes a gate and a graphene channel, and a gate voltage source, the method comprising:
modulating a gate voltage on the gate such that an electric current through the graphene channel exhibits negative differential resistance,
wherein the NDR device further comprises a gate dielectric contacting the gate, the graphene channel contacting the gate dielectric, and source and drain electrodes contacting the gate dielectric and the graphene channel,
wherein a thickness of the gate dielectric is in a range from 0.5 nm to 50 nm, a dielectric constant of the gate dielectric is in a range from 2 to 50, and a carrier mobility of the graphene channel is in a range from 100 (cm²/Vs) to 1 million (cm²/Vs),
wherein the circuit further comprises a bias voltage source which modulates a bias voltage between the source and drain electrodes,
wherein the bias voltage comprises a range of bias voltages, and the gate voltage source modulates the gate voltage on the gate such that the electric current through the graphene channel exhibits negative differential resistance over the range of bias voltages, and
wherein the gate voltage source modulates the gate voltage such that the gate voltage satisfies the following:

$$V_G^2 > 8\left(\frac{\sigma_{min}}{C \cdot \mu}\right)^2 \qquad \text{Eq. (5)}$$

where:
$\sigma_{min}$ is a minimum conductivity of the graphene channel of the NDR device;
C is a capacitance of the gate; and
$\mu$ is a mobility of carriers in the graphene channel.

* * * * *